United States Patent
Hasegawa et al.

(10) Patent No.: US 7,193,832 B2
(45) Date of Patent: Mar. 20, 2007

(54) MAGNETICALLY COUPLED DEVICE AND ELECTRONIC EQUIPMENT EMPLOYING SAME

(75) Inventors: Yasushi Hasegawa, Yamatotakada (JP); Taiji Maeda, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 414 days.

(21) Appl. No.: 10/899,088

(22) Filed: Jul. 27, 2004

(65) Prior Publication Data
US 2005/0036265 A1 Feb. 17, 2005

(30) Foreign Application Priority Data
Jul. 28, 2003 (JP) ............... 2003-281029

(51) Int. Cl.
*H01H 47/00* (2006.01)
(52) U.S. Cl. ................... 361/139; 340/870.31
(58) Field of Classification Search ........ 369/135, 369/149; 361/139; 324/311; 340/870.31, 340/870.32
See application file for complete search history.

(56) References Cited

U.S. PATENT DOCUMENTS

| | | | | |
|---|---|---|---|---|
| 3,768,003 A | * | 10/1973 | Amen | ............ 324/311 |
| 4,725,779 A | * | 2/1988 | Hyde et al. | ............ 324/318 |
| 5,003,260 A | * | 3/1991 | Auchterlonie | ...... 324/207.16 |
| 5,359,466 A | * | 10/1994 | Fuji et al. | ............ 360/46 |
| 5,952,849 A | | 9/1999 | Haigh | |
| 6,376,933 B1 | | 4/2002 | Goetz et al. | |

FOREIGN PATENT DOCUMENTS

JP 10-189368 A 7/1998

\* cited by examiner

*Primary Examiner*—Timothy Edwards, Jr.
(74) *Attorney, Agent, or Firm*—Birch, Stewart, Kolasch & Birch, LLP

(57) ABSTRACT

If external magnetic field(s) (external noise) is/are present, equivalent noise component(s) might be produced at both receiving coil(s) and dummy coil(s), and respective noise components from receiving coil(s) and dummy coil(s) might be made to at least partially cancel out one another at differential amplifier(s), substantially only signal component(s) due to magnetic field(s) from transmitting coil(s) being applied by way of differential amplifier(s) to comparator(s), where same is/are binarized and is/are moreover output by way of output control circuitry and respective transistor(s).

14 Claims, 7 Drawing Sheets

I = I' = I"

MAGNETICALLY COUPLED DEVICE AND ELECTRONIC EQUIPMENT EMPLOYING SAME

BACKGROUND OF INVENTION

This application claims priority to Patent Application No. 2003-281029 filed in Japan on 28 Jul. 2003, the content of which is incorporated herein by reference in its entirety.

The present invention pertains to a magnetically coupled device in which insulator layer(s) intervene between mutually magnetically coupled transmitting coil(s) and receiving coil(s), input of signal(s) at transmitting coil(s) causing output at receiving coil(s) of signal(s) produced at least partially by induction due to magnetic coupling therebetween; and to electronic equipment employing same.

As is known, optically coupled devices, employed in a wide variety of electronic equipment, are provided with light-emitting element(s) at input side(s) thereof and light-receiving element(s) at output side(s) thereof, signal transmission taking place with input side(s) being electrically isolated from output side(s).

It so happens that in recent years magnetically coupled devices, with their faster communication rates, have drawn more attention than optically coupled devices due to increases in transmission speed (on the order of between 50 Mb/s and 100 Mb/s), representative of which is the situation existing with respect to fieldbus networks for factory automation equipment and the like.

Among such magnetically coupled devices is, for example, that disclosed at U.S. Pat. No. 6,376,933. In this magnetically coupled device, which comprises bridge circuitry including magnetoresistive sensor(s) for which resistance varies in correspondence to magnetic field strength, magnetoresistive sensor(s) is/are used to detect input magnetic field(s), output signal(s) from magnetoresistive sensor(s) is/are extracted from bridge circuitry, such output signal(s) is/are fed back thereinto, output magnetic field(s) is/are produced, and output signal(s) from magnetoresistive sensor(s) is/are extracted to the exterior while control is carried out so as to cause input magnetic field(s) and output magnetic field(s) to cancel out one another. Here, because output signal(s) is/are fed back thereinto, input magnetic field(s) and output magnetic field(s) being made to cancel out one another, internal noise generated at output-signal-side circuitry is canceled out.

However, the foregoing conventional magnetoresistive devices have had the problem that, even where it may have been possible to reduce internal noise, as no consideration had been made for reduction of geomagnetism and other such external noise, there has been occurrence of distortion of output signal waveform(s) and/or phenomena such as dropped bits during communication of output signal(s), preventing normal communication.

The present invention was therefore conceived in light of the foregoing conventional issues, it being an object thereof to provide a magnetically coupled device capable of reducing effects of external noise and of stably carrying out high-speed communication.

SUMMARY OF INVENTION

In order to achieve the foregoing object and/or other objects, a magnetically coupled device in accordance with one or more embodiments of the present invention may comprise one or more transmitting coils; one or more receiving coils; one or more insulator layers; one or more dummy coils; and one or more logic components; wherein at least one of the transmitting coil or coils and at least one of the receiving coil or coils are mutually magnetically coupled and at least one of the insulator layer or layers intervenes therebetween; input of at least one signal at at least one of the transmitting coil or coils causes output at at least one of the receiving coil or coils of at least one signal produced at least partially by induction due to magnetic coupling therebetween; at least one of the dummy coil or coils is arranged more or less in the vicinity of at least one of the receiving coil or coils; and at least one of the logic component or components determines at least one difference between at least one signal at at least one of the receiving coil or coils and at least one signal at at least one of the dummy coil or coils.

Magnetically coupled devices in accordance with such embodiment(s) of the present invention are such that transmitting coil(s) and receiving coil(s) are mutually magnetically coupled, signal(s) being transmitted from transmitting coil(s) to receiving coil(s). Moreover, dummy coil(s) may be arranged more or less in vicinity or vicinities of receiving coil(s), and difference(s) between or among receiving coil signal(s) and dummy coil signal(s) may be determined. Such arrangement of dummy coil(s) may permit weakening of magnetic coupling between or among dummy coil(s) and transmitting coil(s), and may permit equivalent external magnetic field(s) to be detected at both receiving coil(s) and dummy coil(s). Dummy coil output(s) would therefore contain almost no signal component(s) generated due to magnetic field(s) from transmitting coil(s), but would contain noise component(s) generated due to external magnetic field(s). On the other hand, receiving coil output(s) would contain high levels of signal component(s) generated due to magnetic field(s) from transmitting coil(s), and would contain noise component(s) generated due to external magnetic field(s) in more or less equivalent fashion as compared with that at dummy coil(s). This being the case, by determining difference(s) between or among receiving coil signal(s) and dummy coil signal(s), it is possible to at least partially cancel out noise component(s) due to external magnetic field(s) and to extract signal component(s) due to transmitting coil magnetic field(s) with almost no loss. As a result, it is possible to reduce effects of external noise and stably carry out high-speed communication between or among transmitting coil(s) and receiving coil(s).

Furthermore, one or more embodiments of the present invention may comprise one or more first dummy coils; and one or more second dummy coils; wherein at least one of the first dummy coil or coils or at least one of the second dummy coil or coils is provided with at least one shield member for at least partially blocking at least one external magnetic field.

Thus, magnetically coupled devices in accordance with such embodiment(s) of the present invention are provided with one or more first dummy coils; and one or more second dummy coils; wherein at least one of the first dummy coil or coils or at least one of the second dummy coil or coils is provided with at least one shield member for at least partially blocking at least one external magnetic field. Shield member(s) may, for example, be provided at second dummy coil(s). In such a case, second dummy coil output(s) would contain almost no noise component(s) due to external magnetic field(s) and almost no signal component(s) due to magnetic field(s) from transmitting coil(s), but would contain substantially only internal noise component(s). This being the case, by determining difference(s) between or among receiving coil signal(s) and second dummy coil signal(s), it is possible to substantially eliminate internal noise component(s) contained within receiving coil signal(s). Alternatively or in addition thereto, by determining difference(s) between or among receiving coil signal(s) and first dummy coil signal(s), it is possible as previously mentioned to substantially eliminate noise component(s) due to external magnetic field(s) which is/are contained within receiving coil signal(s). By carrying out appropriate logic operation(s) on respective receiving coil signal(s) from which internal noise component(s) and/or noise component(s) due to external magnetic field(s) has or have been substantially eliminated in such fashion, it is possible to reduce internal noise component(s) and/or noise component(s) due to external magnetic field(s), and to satisfactorily extract signal component(s) due to transmitting coil magnetic field(s).

Moreover, in one or more embodiments of the present invention, at least one of the receiving coil or coils may be disposed between at least one of the first dummy coil or coils and at least one of the second dummy coil or coils. Furthermore, one or more embodiments of the present invention may comprise a plurality of dummy coils; wherein respective dummy coils and receiving coil or coils are arranged such that respective distances separating respective dummy coils from receiving coil or coils are substantially the same.

Thus, in magnetically coupled devices in accordance with embodiment(s) of the present invention, receiving coil(s) may be disposed between first dummy coil(s) and second dummy coil(s). Alternatively or in addition thereto, one or more embodiments of the present invention may comprise a plurality of dummy coils; wherein respective dummy coils and receiving coil(s) are arranged such that respective distances separating respective dummy coils from receiving coil(s) are substantially the same. This being the case, respective dummy coil(s) will permit more or less accurate detection of external magnetic field(s) detected by receiving coil(s).

Furthermore, in one or more embodiments of the present invention, at least one number of turn or turns of at least one of the receiving coil or coils and at least one number of turn or turns of at least one of the dummy coil or coils may be substantially identical.

Thus, in magnetically coupled devices in accordance with embodiment(s) of the present invention, number(s) of turn(s) of receiving coil(s) and number(s) of turn(s) of dummy coil(s) may be substantially identical. This will make it possible to cause receiving coil noise component(s) due to external magnetic field(s) and dummy coil noise component(s) due to external magnetic field(s) to be set to equivalent level(s), making it possible to definitively cause noise component(s) due to external magnetic field(s) to be canceled out through determination of difference(s) between or among receiving coil output(s) and dummy coil output(s).

Furthermore, in one or more embodiments of the present invention, at least one antimagnetic member for at least partially shielding at least one of the dummy coil or coils from at least one magnetic field of at least one of the transmitting coil or coils may be provided between at least one of the receiving coil or coils and at least one of the dummy coil or coils.

Thus, in magnetically coupled devices in accordance with embodiment(s) of the present invention, because antimagnetic member(s) is/are provided between receiving coil(s) and dummy coil(s), dummy coil(s) may be at least partially shielded from magnetic field(s) of transmitting coil(s). This being the case, it will be possible to adequately reduce dummy coil signal component(s) due to transmitting coil magnetic field(s); and by determining difference(s) between or among receiving coil output(s) and first dummy coil output(s), it will be possible to extract signal component(s) due to transmitting coil magnetic field(s) with almost no loss.

Furthermore, one or more embodiments of the present invention may comprise a plurality of sets of receiving coils and dummy coils; wherein at least one shielding member for at least partially blocking at least one magnetic field acting in mutual fashion between or among at least a portion of the respective sets is disposed between or among at least a portion of the respective sets.

Thus, because magnetically coupled devices in accordance with embodiment(s) of the present invention is/are predicated upon provision of a plurality of sets of receiving coils and dummy coils, shielding member(s) being disposed between or among at least a portion of the respective sets, magnetic field(s) acting in mutual fashion between or among respective sets may be least partially blocked.

Moreover, electronic equipment in accordance with one or more embodiments of the present invention may employ one or more magnetically coupled devices according to any of the foregoing embodiments of the present invention.

Thus, the present invention is not limited to magnetically coupled devices but encompasses electronic equipment employing such magnetically coupled device(s). Such electronic equipment may include not only factory automation equipment and the like, but may also include DVD, CD, MD, and/or other such player-type apparatuses, image-receiving apparatuses, power supplies, inverters, and/or any other type of equipment whatsoever, provided only that it contains circuitry in which transmission of signal(s) is carried out with isolation between input(s) and output(s).

DESCRIPTION OF PREFERRED EMBODIMENTS

Below, embodiments of the present invention are described in detail with reference to the attached drawings.

(Embodiment 1)

Figure 1:
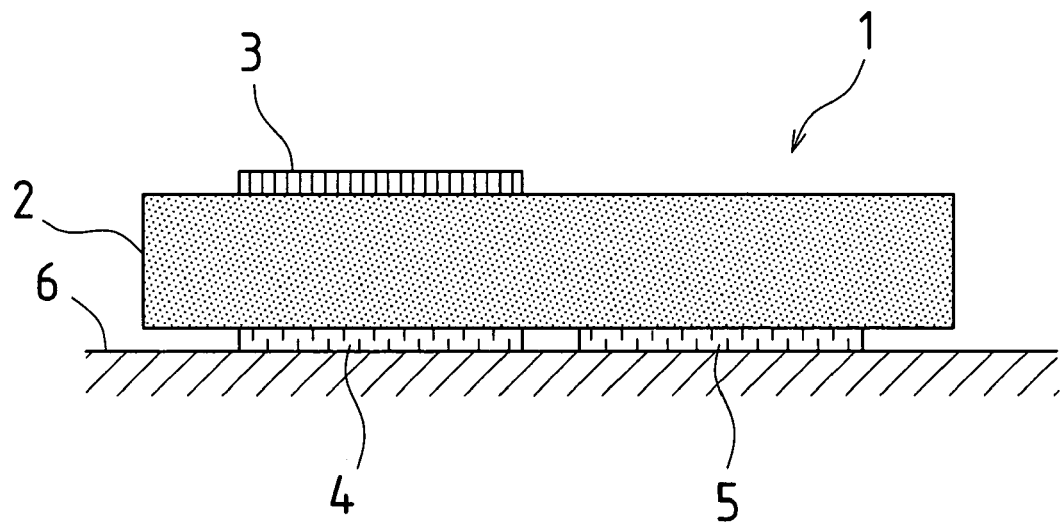
FIG. 1 is a side view showing in schematic fashion a first embodiment of a magnetically coupled device in accordance with the present invention.
Figure 2:
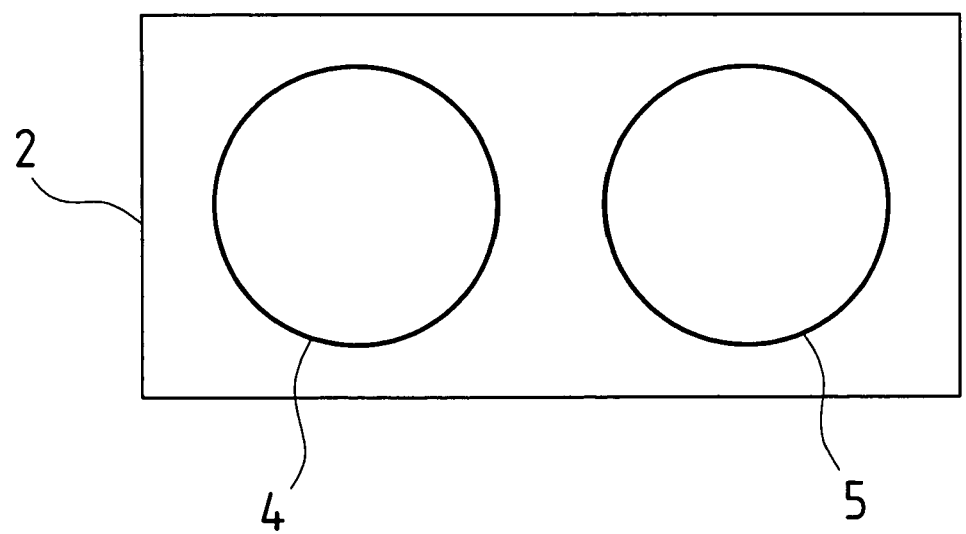
FIG. 2 is a bottom view showing the magnetically coupled device of FIG. 1.

FIGS. 1 and 2 are a side view and a bottom view showing in schematic fashion a first embodiment of a magnetically coupled device in accordance with the present invention. Magnetically coupled device 1 of the present embodiment, present on receiving chip 6, is provided with insulator layer 2; transmitting coil 3 which is disposed above insulator layer 2; and receiving coil 4 and dummy coil 5 which are disposed beneath insulator layer 2.

Transmitting coil 3 and receiving coil 4 are stacked one atop the other with insulator layer 2 intervening therebetween, and are mutually magnetically coupled. Since dummy coil 5 is disposed adjacent to receiving coil 4 and is displaced relative to transmitting coil 3, it is not magnetically coupled to transmitting coil 3. Receiving coil 4 and dummy coil 5 have the same number of turns.

Insulator layer 2 is formed by using a method such as spin coating or the like to apply a film of polyimide or other such insulator material thereto. With respect to the top and bottom surfaces of insulator layer 2, it is to be desired for formation and arrangement of respective coils 3, 4, 5 that those surfaces extend over flat domains that are sufficiently broader than those respective coils 3, 4, 5. Furthermore, since, during use of spin coating or other such method to form insulator layer 2, insulator layer 2 can become sloped in the vicinity of the end regions thereof, the size of insulator layer 2 must in such case be set such that respective coils 3, 4, 5 do not occupy such sloped regions. Moreover, in the case of magnetically coupled device 1 as would be the case with an optically coupled device, insulator layer 2 must be given appropriate thickness(es) in order to meet electrical insulation characteristics of foreign safety standards. It will ordinarily be necessary to give insulator layer 2 a minimum thickness of 0.15 mm, and where possible a thickness of not less than 0.4 mm.

Figure 3:
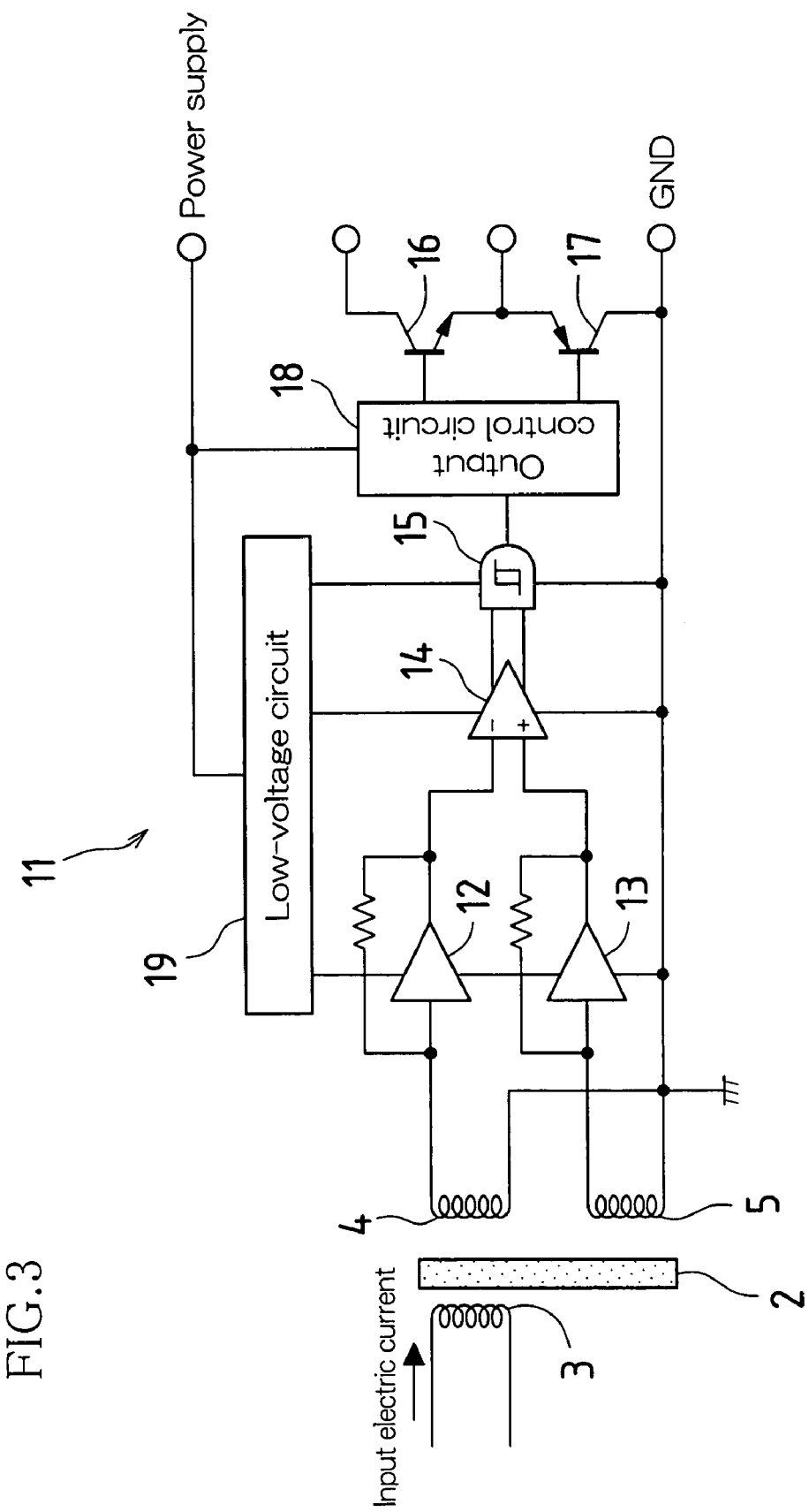
FIG. 3 is a block diagram showing signal processing circuitry for processing signal(s) output from the magnetically coupled device of FIG. 1.

FIG. 3 shows signal processing circuit 11 for processing signals respectively output from receiving coil 4 and dummy coil 5 of magnetically coupled device 1. This signal processing circuit 11 is equipped with amplifiers 12, 13 respectively amplifying respective output signals from receiving coil 4 and dummy coil 5; differential amplifier 14 determining difference(s) between respective output signals from respective amplifiers 12, 13; comparator 15 converting signal(s) output from differential amplifier 14 into binary signal(s); respective transistors 16, 17 for outputting binary signal(s); output control circuit 18 controlling respective transistors 16, 17 in correspondence to binary signal(s) from comparator 15; and low-voltage circuit 19 serving as power supply or supplies for respective amplifiers 12 through 14 and comparator 15.

Here, it is first assumed that there is no external magnetic field (external noise). In such case, application of an input signal at transmitting coil 3 causes signal current to flow in transmitting coil 3, producing a magnetic field passing through the center of transmitting coil 3 that is perpendicular to transmitting coil 3 in accordance with Ampere's right-hand rule, this magnetic field passes through the center of receiving coil 4 by way of intervening insulator layer 2, an induced electric current is produced at receiving coil 4, and this induced electric current is applied as an output signal to signal processing circuit 11. Furthermore, because the magnetic field passing through the center of transmitting coil 3 does not pass through the center of dummy coil 5, almost no induced electric current due to the magnetic field of transmitting coil 3 is produced at dummy coil 5, and there is no output signal from dummy coil 5.

At signal processing circuit 11, the output signal from receiving coil 4 is amplified by amplifier 12 and is then applied to the inverting input terminal of differential amplifier 14. Furthermore, because there is no output signal from dummy coil 5, nothing is output from amplifier 13, and nothing is input at the noninverting input terminal of differential amplifier 14. This being the case, differential amplifier 14 inverts and amplifies the output signal from receiving coil 4, and this is then applied to comparator 15. Comparator 15 compares the output from differential amplifier 14 to previously established threshold(s), binarizing that output, and the binarized signal is applied to output control circuit 18. Output control circuit 18 controls respective transistors 16, 17 in correspondence to the binary signal, causing a binarized signal to be output from respective transistors 16, 17.

Accordingly, in the event that there is no external magnetic field (external noise), application of an input signal at transmitting coil 3 will result in output of an output signal from receiving coil 4. This output signal will be applied by way of amplifier 12 and differential amplifier 14 to comparator 15, where it will be binarized; and it will moreover be output by way of output control circuit 18 and respective transistors 16, 17.

Next, it is assumed that external noise is present. In such case as well, application of an input signal at transmitting coil 3 causes production of a magnetic field at transmitting coil 3, inducing a signal in receiving coil 4. However, at the same time, the external magnetic field causes noise to also be induced at receiving coil 4. This being the case, the output from receiving coil 4 will contain a signal component due to the magnetic field of transmitting coil 3, and a noise component due to the external magnetic field.

Furthermore, external noise is produced uniformly over a broad region at the periphery of receiving coil 4. Also, receiving coil 4 and dummy coil 5 have the same number of turns. This being the case, noise equivalent to that at receiving coil 4 is also induced at dummy coil 5 due to the external magnetic field. However, as previously mentioned, almost no induced electric current due to the magnetic field of transmitting coil 3 will be produced at dummy coil 5. This being the case, the output from dummy coil 5 will contain only the noise component due to the external magnetic field.

At signal processing circuit 11, the output from receiving coil 4 is amplified by amplifier 12 and is then applied to the inverting input terminal of differential amplifier 14; moreover, the output from dummy coil 5 is amplified by amplifier 13 and is then applied to the noninverting input terminal of differential amplifier 14. Differential amplifier 14 outputs the difference between the output from receiving coil 4 and the output from dummy coil 5. Because, as previously mentioned, the output from receiving coil 4 contains the signal component due to the magnetic field of transmitting coil 3 and the noise component due to the external magnetic field, and the output from dummy coil 5 contains only the noise component due to the external magnetic field, the difference between the output from receiving coil 4 and the output from dummy coil 5 will be only the signal component due to the magnetic field of transmitting coil 3, the noise component due to the external magnetic field having been canceled out. Accordingly, it will be only the signal component due to the magnetic field of transmitting coil 3 that is output from differential amplifier 14 and applied to comparator 15. Comparator 15 binarizes the signal component due to the magnetic field of transmitting coil 3, and applies the binarized signal to output control circuit 18.

Output control circuit 18 causes a binarized signal to be output from respective transistors 16, 17.

Accordingly, in the event that an external magnetic field (external noise) is present, because equivalent noise components are produced at both receiving coil 4 and dummy coil 5, and respective noise components from receiving coil 4 and dummy coil 5 are made to cancel out one another at differential amplifier 14, only the signal component due to the magnetic field of transmitting coil 3 is applied by way of differential amplifier 14 to comparator 15, where same is binarized and is moreover output by way of output control circuit 18 and respective transistors 16, 17.

Thus, in the present embodiment, regardless of whether or not external magnetic field(s) is/are present, only signal component(s) due to magnetic field(s) of transmitting coil 3 is/are applied from receiving coil 4 to comparator 15 by way of differential amplifier 14, and such signal component(s) is/are binarized and is/are output.

Note, moreover, in the event that levels of noise due to external magnetic field(s) are different at receiving coil 4 and dummy coil 5 when number of turn(s) at receiving coil 4 is made the same as number of turn(s) at dummy coil 5 as a result of directionality and/or the like of external magnetic field(s), levels of noise due to external magnetic field(s) might be made the same at receiving coil 4 and dummy coil 5 by making number of turn(s) at receiving coil 4 different from number of turn(s) at dummy coil 5.

Figure 4:
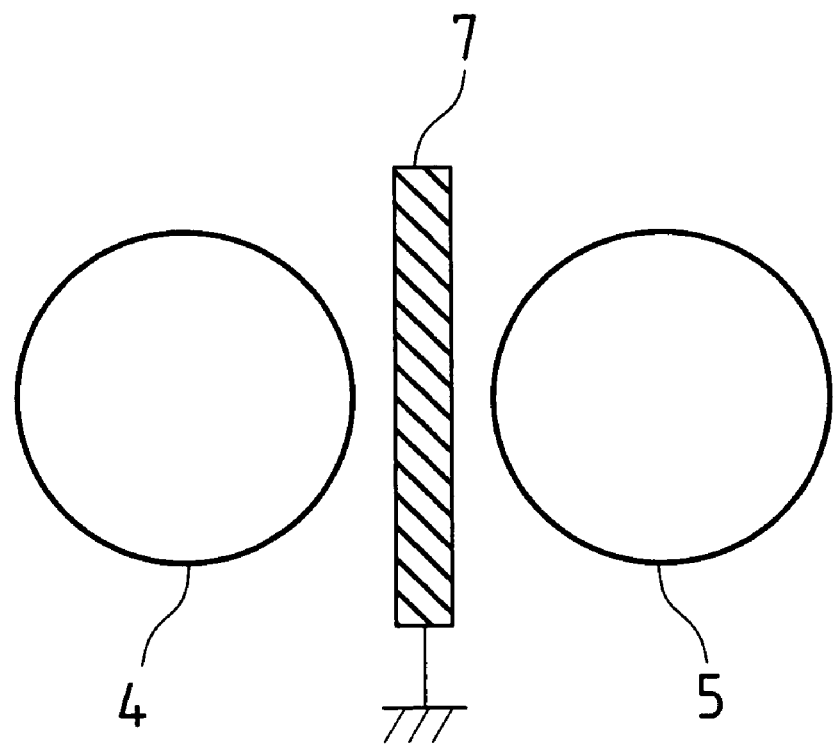
FIG. 4 is a bottom view showing a variation on the magnetically coupled device of FIG. 1.

Furthermore, in the event that magnetic field(s) at transmitting coil 3 affect dummy coil 5, causing high levels of signal(s) to be produced at dummy coil 5, grounded antimagnetic wall(s) 7 might be provided between receiving coil 4 and dummy coil 5 as shown in FIG. 4. Such antimagnetic wall(s) 7 would permit dummy coil 5 to be at least partially shielded from magnetic field(s) of transmitting coil 3, sufficiently reducing signal level(s) at dummy coil 5 due to magnetic field(s) of transmitting coil 3. This being the case, by determining difference(s) between signal(s) at receiving coil 4 and signal(s) at dummy coil 5, it will be possible to extract signal(s) at receiving coil 4 due to magnetic field(s) at transmitting coil 3 with almost no loss.

(Embodiment 2)

Figure 5:
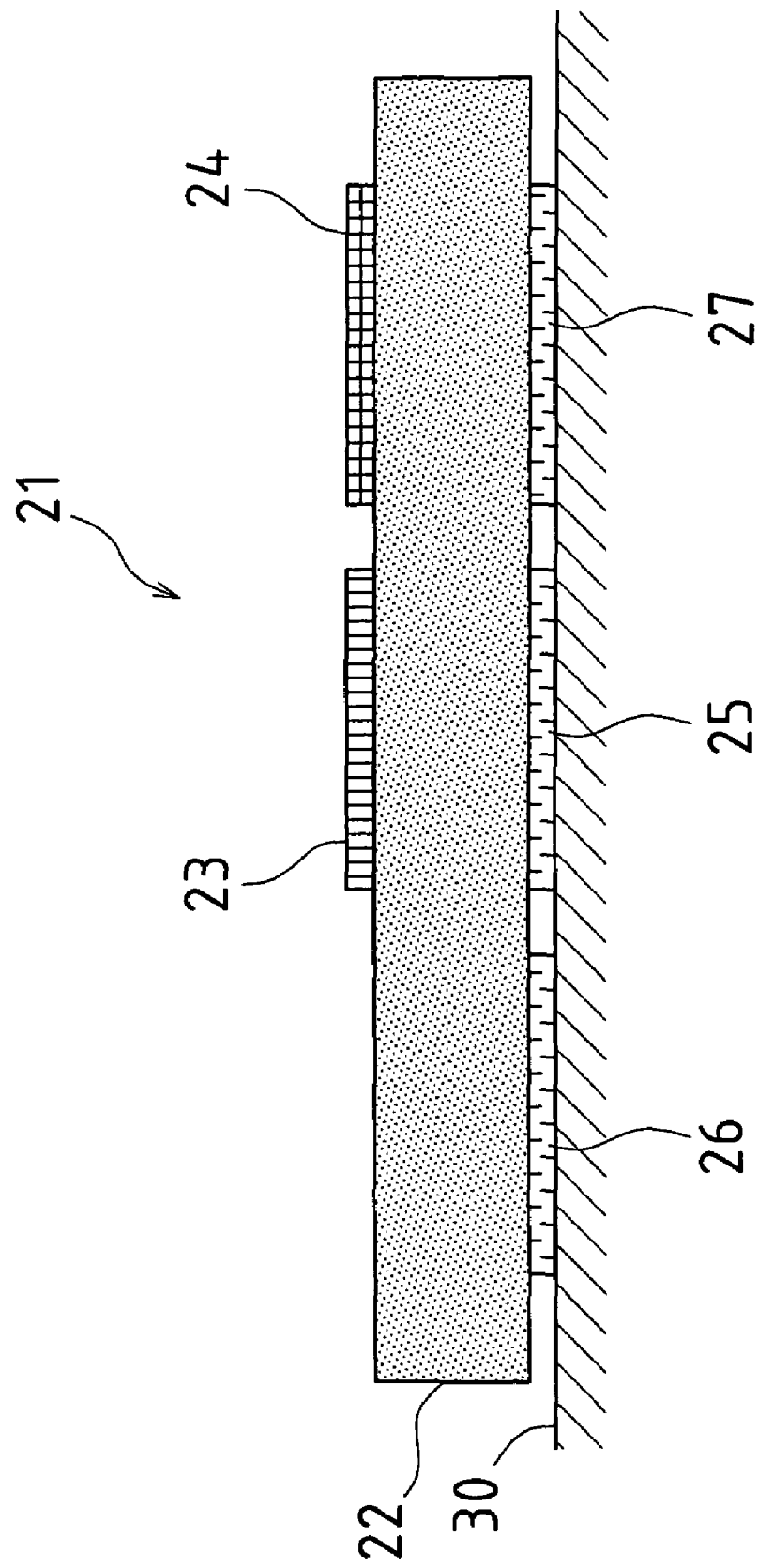
FIG. 5 is a side view showing in schematic fashion a second embodiment of a magnetically coupled device in accordance with the present invention.
Figure 6:
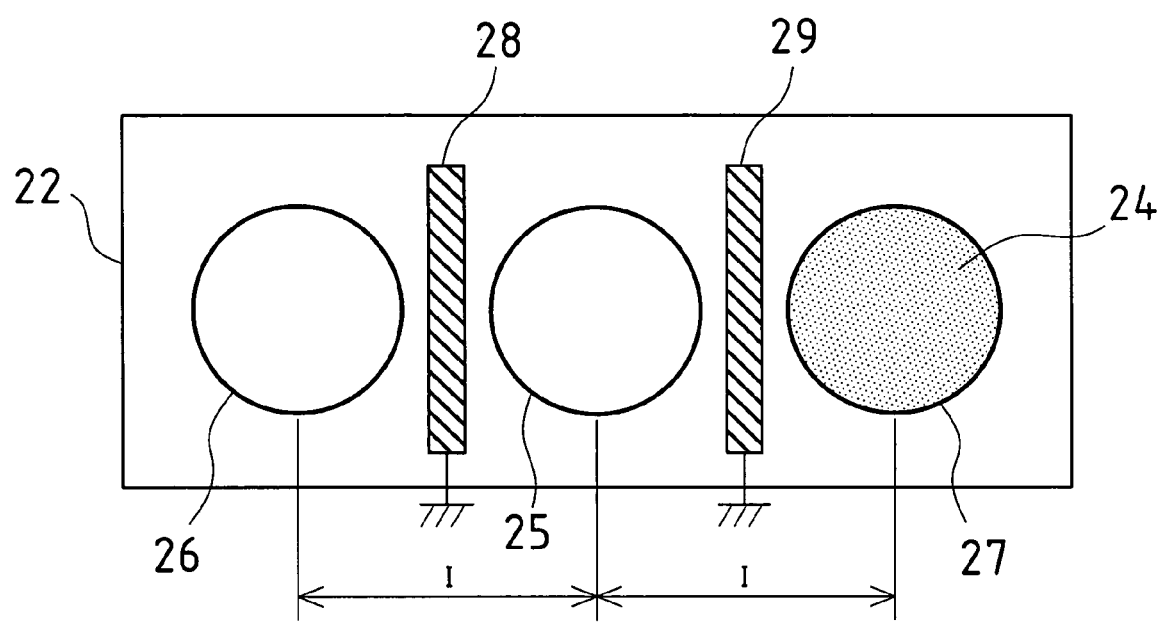
FIG. 6 is a bottom view showing the magnetically coupled device of FIG. 5.

FIGS. 5 and 6 are a side view and a bottom view showing in schematic fashion a second embodiment of a magnetically coupled device in accordance with the present invention. Magnetically coupled device 21 of the present embodiment, present on receiving chip 30, is provided with insulator layer 22; transmitting coil 23 and shield plate 24 which are disposed above insulator layer 22; receiving coil 25 which is disposed beneath insulator layer 22; first and second dummy coils 26, 27 which are also disposed beneath same; and respective antimagnetic walls 28, 29 which are grounded and which are disposed between receiving coil 25 and first and second dummy coils 26, 27.

Transmitting coil 23 and receiving coil 25 are stacked one atop the other with insulator layer 22 intervening therebetween, and are mutually magnetically coupled. Since first and second dummy coils 26, 27 are disposed adjacent to and to either side of receiving coil 25, and are displaced relative to transmitting coil 23, they are not magnetically coupled to transmitting coil 23. Receiving coil 25 and first and second dummy coils 26, 27 have the same number of turns.

Respective distances I separating receiving coil 25 from first and second dummy coils 26, 27 are identical. Respective antimagnetic walls 28, 29 between receiving coil 25 and first and second dummy coils 26, 27 are for at least partially shielding first and second dummy coils 26, 27 from magnetic field(s) of transmitting coil 23, and for sufficiently reducing level(s) of signal(s) at first and second dummy coils 26, 27 produced by magnetic field(s) from transmitting coil 23.

Shield plate 24, stacked atop second dummy coil 27 with insulator layer 22 intervening therebetween, is grounded and at least partially shields second dummy coil 27 from external magnetic field(s).

Figure 7:
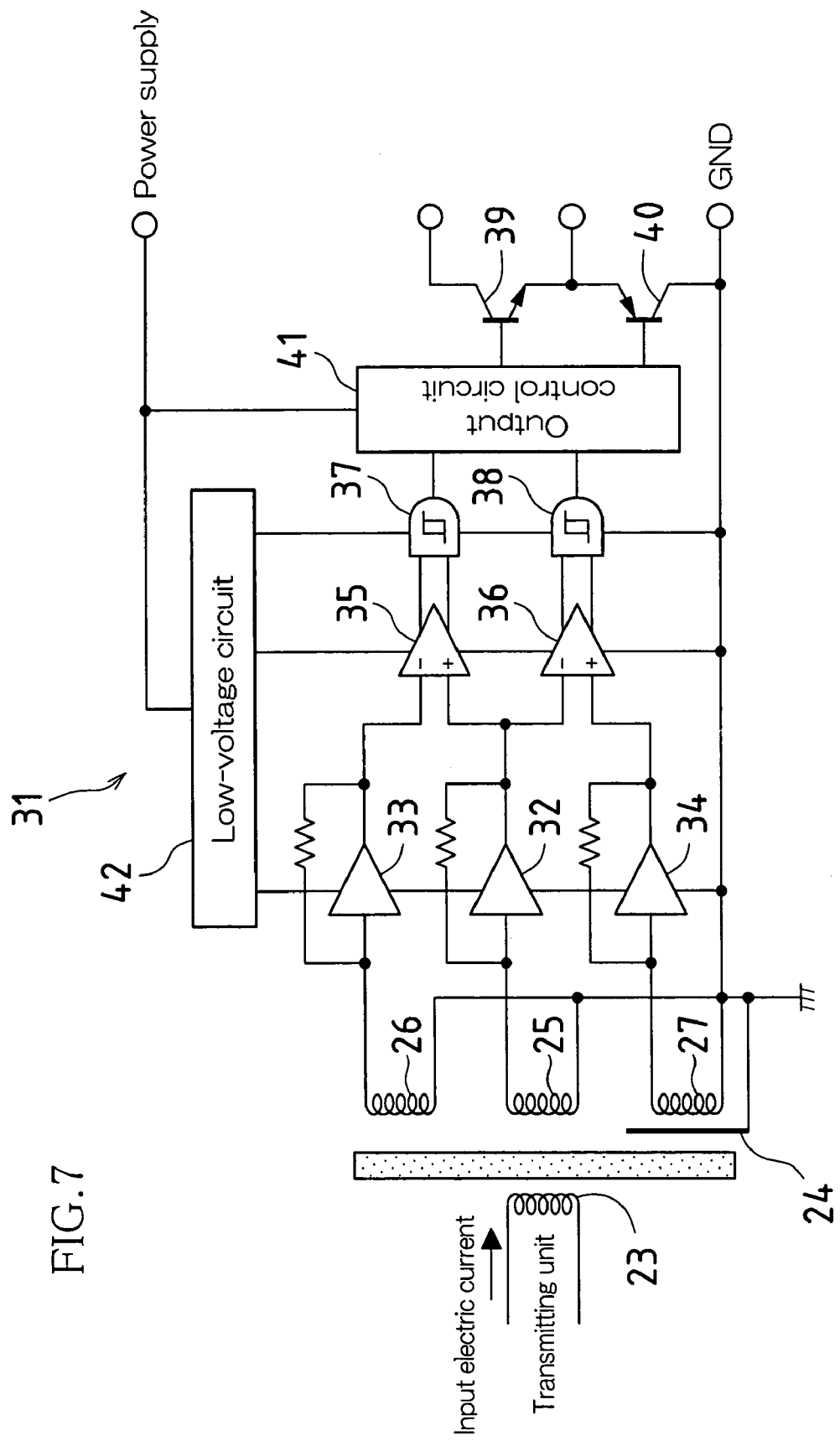
FIG. 7 is a block diagram showing signal processing circuitry for processing signal(s) output from the magnetically coupled device of FIG. 5.

FIG. 7 shows signal processing circuit 31 for processing signals respectively output from receiving coil 25 and first and second dummy coils 26, 27 of magnetically coupled device 21. This signal processing circuit 31 is equipped with amplifiers 32, 33, 34 respectively amplifying respective output signals from receiving coil 25 and first and second dummy coils 26, 27; first differential amplifier 35 determining difference(s) between respective output signals from respective amplifiers 32, 33; second differential amplifier 36 determining difference(s) between respective output signals from respective amplifiers 32, 34; first comparator 37 converting signal(s) output from first differential amplifier 35 into binary signal(s); second comparator 38 converting signal(s) output from second differential amplifier 36 into binary signal(s); respective transistors 39, 40 for outputting binary signal(s); output control circuit 41 controlling respective transistors 39, 40 in correspondence to binary signal(s) from first and second comparators 37, 38; and low-voltage circuit 42 serving as power supply or supplies for respective amplifiers 32 through 36 and respective comparators 37, 38.

Here, it will be assumed that the output from receiving coil 25 contains not only a signal component due to the magnetic field of transmitting coil 23 and a noise component due to the external magnetic field, but also contains a noise component generated internally by the magnetically coupled device 21.

Furthermore, because almost no signal component due to the magnetic field from transmitting coil 23 is generated at first dummy coil 26, the output from this first dummy coil 26 will contain the noise component due to the external magnetic field.

Moreover, because almost no signal component due to the magnetic field from transmitting coil 23 is generated at second dummy coil 27 and because shield plate 24 at least partially shields this second dummy coil 27 from the external magnetic field, the output from this second dummy coil 27 will contain the noise component generated internally at signal processing circuit 31.

Now, at signal processing circuit 31, the output from receiving coil 25 is, by way of amplifier 32, applied to the inverting input terminal of first differential amplifier 35; and the output from first dummy coil 26 is, by way of amplifier 33, applied to the noninverting input terminal of first differential amplifier 35. First differential amplifier 35 outputs the difference between the output from receiving coil 25 and the output from first dummy coil 26. This difference that is output, being the output of receiving coil 25 but with the noise component due to the external magnetic field having been substantially eliminated therefrom, is binarized by first comparator 37 and is then applied to output control circuit 41. Furthermore, the output from receiving coil 25 is, by way of amplifier 32, applied to the inverting input terminal of second differential amplifier 36; and the output from second dummy coil 27 is, by way of amplifier 34, applied to the noninverting input terminal of second differential amplifier 36. Second differential amplifier 36 outputs the difference between the output from receiving coil 25 and the output from second dummy coil 27. This difference that is output, being the output of receiving coil 25 but with the noise component generated internally at signal processing circuit 31 having been substantially eliminated therefrom, is binarized by second comparator 38 and is then applied to output control circuit 41.

Output control circuit 41 accepts input of respective binarized signals from first and second comparators 37, 38, and by carrying out logic operation processing on these binarized signals, reduces effect(s) of internal noise component(s) and/or noise component(s) due to external magnetic field(s), causing binarized signal(s) containing substantially only signal component(s) due to magnetic field(s) from transmitting coil 23 to be output by respective transistors 39, 40. As one example of logic operation processing that may be carried out by output control circuit 41, processing may be carried out to determine the logical sum of the respective binarized signals from first and second comparators 37, 38.

Figure 8:
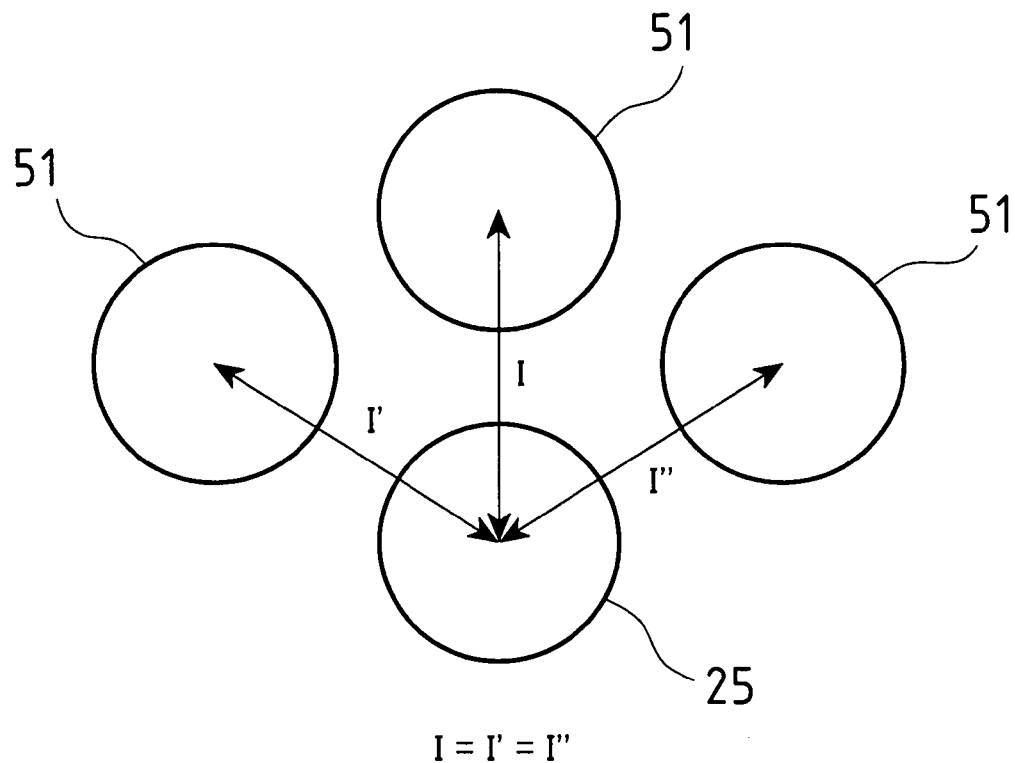
FIG. 8 is a bottom view showing a variation on the magnetically coupled device of FIG. 5.

Note that whereas the present embodiment employs first and second dummy coils, there is no objection to employment of three or more dummy coils. In such case, if as shown in FIG. 8 respective distances separating receiving coil 25 from respective dummy coils 51 are made substantially the same and outputs of respective dummy coils 51 are then averaged, more or less accurate detection of external magnetic field(s) detected by receiving coil 25 will be possible. This being the case, by determining difference(s) between or among output(s) from receiving coil 25 and average(s) of output(s) from respective dummy coils 51, it will be possible to substantially eliminate noise component(s) due to external magnetic field(s) from output(s) of receiving coil 25. Notwithstanding that in light of the size of receiving chip 30 and other considerations it is thought appropriate to hold the number of dummy coils to on the order of three, it is nonetheless possible to arrange four or more dummy coils therein.

Figure 9:
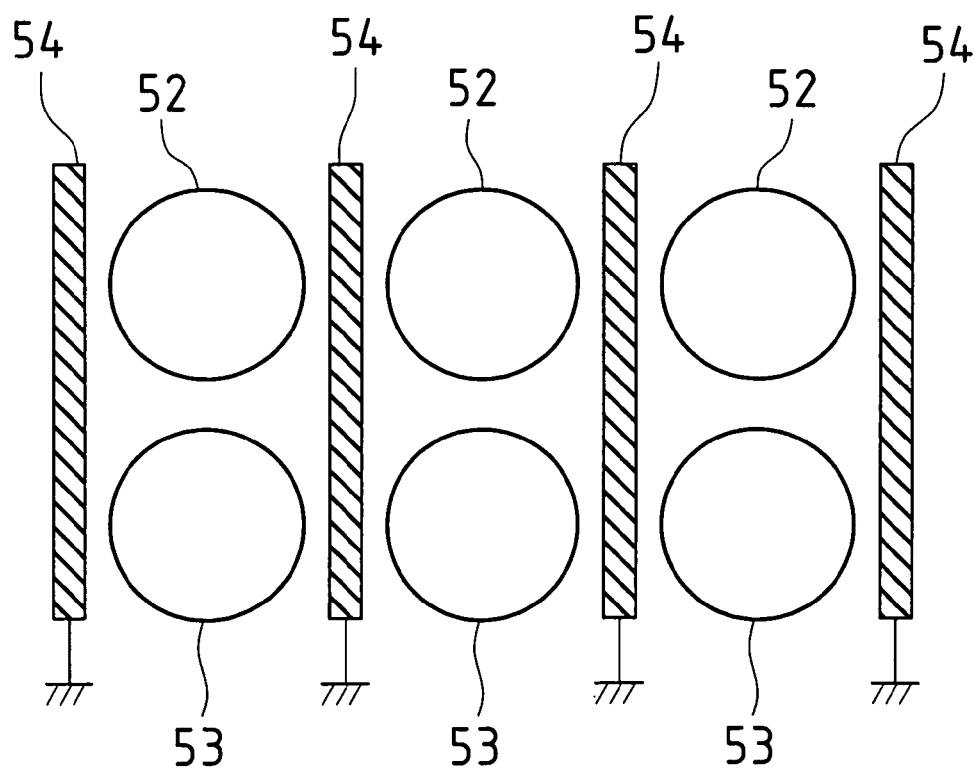
FIG. 9 is a bottom view showing another variation on the magnetically coupled device of FIG. 5.

Furthermore, where as shown in FIG. 9 a plurality of sets of receiving coils 52 and dummy coils 53 are provided in combination with one or more transmitting coils (not shown), antimagnetic walls 54 ("shielding members" in the language of the present invention) might be provided between or among respective sets, at least partially blocking magnetic field(s) acting in mutual fashion between or among respective sets and reducing crosstalk between or among respective sets. Moreover, where the size of receiving chip 30 permits, there is no objection to providing antimagnetic wall(s) between or among receiving coil(s) 52 and dummy coil(s) 53 of each individual set.

Moreover, the present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

What is claimed is:

1. A magnetically coupled device comprising:
   one or more transmitting coils;
   one or more receiving coils;
   one or more insulator layers;
   one or more dummy coils; and
   one or more logic components;
   wherein at least one of the transmitting coil or coils and at least one of the receiving coil or coils are mutually magnetically coupled and at least one of the insulator layer or layers intervenes therebetween;
   input of at least one signal at at least one of the transmitting coil or coils causes output at at least one of the receiving coil or coils of at least one signal produced at least partially by induction due to magnetic coupling therebetween;
   at least one of the dummy coil or coils is arranged more or less in the vicinity of at least one of the receiving coil or coils; and
   at least one of the logic component or components determines at least one difference between at least one signal at at least one of the receiving coil or coils and at least one signal at at least one of the dummy coil or coils.

2. A magnetically coupled device according to claim 1 comprising:
   one or more first dummy coils; and
   one or more second dummy coils;
   wherein at least one of the first dummy coil or coils or at least one of the second dummy coil or coils is provided with at least one shield member for at least partially blocking at least one external magnetic field.

3. A magnetically coupled device according to claim 2 wherein at least one of the receiving coil or coils is disposed between at least one of the first dummy coil or coils and at least one of the second dummy coil or coils.

4. A magnetically coupled device according to claim 1 comprising:
   a plurality of dummy coils;
   wherein respective dummy coils and receiving coil or coils are arranged such that respective distances separating respective dummy coils from receiving coil or coils are substantially the same.

5. A magnetically coupled device according to claim 1 wherein at least one number of turn or turns of at least one of the receiving coil or coils and at least one number of turn or turns of at least one of the dummy coil or coils are substantially identical.

6. A magnetically coupled device according to claim 1 wherein at least one antimagnetic member for at least partially shielding at least one of the dummy coil or coils from at least one magnetic field of at least one of the transmitting coil or coils is provided between at least one of the receiving coil or coils and at least one of the dummy coil or coils.

7. A magnetically coupled device according to claim 1 comprising:
   a plurality of sets of receiving coils and dummy coils;
   wherein at least one shielding member for at least partially blocking at least one magnetic field acting in mutual fashion between or among at least a portion of the respective sets is disposed between or among at least a portion of the respective sets.

8. Electronic equipment employing one or more magnetically coupled devices according to claim 1.

9. Electronic equipment employing one or more magnetically coupled devices according to claim 2.

10. Electronic equipment employing one or more magnetically coupled devices according to claim 3.

11. Electronic equipment employing one or more magnetically coupled devices according to claim 4.

12. Electronic equipment employing one or more magnetically coupled devices according to claim 5.

13. Electronic equipment employing one or more magnetically coupled devices according to claim 6.

14. Electronic equipment employing one or more magnetically coupled devices according to claim 7.

* * * * *